US009008333B2

(12) United States Patent
Quilter

(10) Patent No.: US 9,008,333 B2
(45) Date of Patent: Apr. 14, 2015

(54) GUITAR AMPLIFIER

(75) Inventor: Patrick H. Quilter, Laguna Beach, CA (US)

(73) Assignee: Quilter Labs, LLC, Costa Mesa, CA (US)

( * ) Notice: Subject to any disclaimer, the term of this patent is extended or adjusted under 35 U.S.C. 154(b) by 265 days.

(21) Appl. No.: 13/482,886

(22) Filed: May 29, 2012

(65) Prior Publication Data

US 2013/0136278 A1 May 30, 2013

Related U.S. Application Data

(60) Provisional application No. 61/564,452, filed on Nov. 29, 2011.

(51) Int. Cl.

*G10H 1/00* (2006.01)
*H03G 3/00* (2006.01)
*G10H 3/18* (2006.01)
*H03F 3/217* (2006.01)

(52) U.S. Cl.

CPC ............. *G10H 3/187* (2013.01); *H03F 3/2173* (2013.01)

(58) Field of Classification Search

CPC . H03F 1/327; H03F 2200/549; H03F 1/3276; H03F 3/2171; H03F 2200/66; G10H 3/187; G10H 2210/311; H03G 7/004

USPC ............... 381/58, 59, 61, 120, 121, 101, 102, 381/104, 118, 55; 330/251, 207 A

See application file for complete search history.

(56) References Cited

U.S. PATENT DOCUMENTS 4,272,713 A * 6/1981 Pritchard ..................... 318/696
4,809,336 A * 2/1989 Pritchard ...................... 381/61
4,877,981 A * 10/1989 Gomes ......................... 327/309
5,012,199 A * 4/1991 McKale ......................... 330/51
5,133,014 A 7/1992 Pritchard
5,467,400 A * 11/1995 Keir ............................... 381/61
5,524,055 A * 6/1996 Sondermeyer ................. 381/61
5,636,284 A * 6/1997 Pritchard ....................... 381/61
5,909,145 A 6/1999 Zimmerman
6,107,875 A 8/2000 Pullen et al.
6,111,960 A 8/2000 Aarts et al.
6,249,182 B1 * 6/2001 Pullen ............................ 330/10
7,560,994 B1 7/2009 Lee et al.

(Continued)

OTHER PUBLICATIONS

Kyttala. Solid-State Guitar Amplifiers. Manual [online]. 2008 [retrieved on Jan. 22, 2013]. Retrieved from the internet:<URL: http://www.jeanpierrepoulin.com/PDF/transistor.pdf>. pp. 53, 146,147 and 189.

(Continued)

*Primary Examiner* — Xu Mei
*Assistant Examiner* — Jason R Kurr
(74) *Attorney, Agent, or Firm* — Perkins Coie LLP

(57) ABSTRACT

A device and methods are provided for a guitar amplifier. In one embodiment, an amplifier includes an overdrive shaping circuit including one or more elements for harmonic shaping of a received signal. The amplifier may also include a power amplifier circuit configured to receive the harmonic shaped signal from the overdrive shaping circuit, wherein the power amplifier circuit includes a switchmode amplifier to amplify the harmonic shaped signal includes one or more elements to increase the output impedance of the switchmode amplifier. An output of the amplifier can output a signal with desired harmonic shaping and a dynamic response.

27 Claims, 5 Drawing Sheets

(56) References Cited

U.S. PATENT DOCUMENTS

| | | | | |
|---|---|---|---|---|
| 7,957,539 | B2 * | 6/2011 | Packard | 381/61 |
| 8,582,786 | B2 * | 11/2013 | Kemmerer et al. | 381/107 |
| 2002/0005753 | A1 | 1/2002 | Takagishi | |
| 2011/0033057 | A1 * | 2/2011 | Gallo | 381/61 |

OTHER PUBLICATIONS

International Search Report and Written Opinion; International Patent Application No. PCT/US2012/066871; Applicant: Quilter Labs, LLC; mailed:Feb. 12, 2013, 13 pages.

* cited by examiner

GUITAR AMPLIFIER

CROSS-REFERENCE TO RELATED APPLICATION

This application claims priority to U.S. Provisional Application No. 61/564,452 filed Nov. 29, 2011, the disclosure of which is hereby incorporated by reference.

FIELD

The present disclosure relates generally to amplifier devices and methods, and more particularly to musical instrument amplifiers and, in particular, a guitar amplifier.

BACKGROUND

The electric guitar and its companion amplifier were developed during the era of vacuum-tube amplification, and consequently, guitar pickups and then-current amplifier designs were empirically optimized to work well together. In particular, guitar pickups were wound with many turns of fine wire, in order to produce a high signal voltage that would minimize the number of vacuum tube amplifier stages required. Such a coil has a high inductance, and therefore requires a high input impedance to avoid high frequency losses. Vacuum tubes have naturally high input impedance, and therefore perform well with such pickups. The output impedance of simple vacuum tube amplifiers is also naturally high, which helps overcome the effects of series inductance in the loudspeaker coil, especially in open loop designs, which were often used to reduce cost. This increases the effective bandwidth reproduced by the speaker. The combined results of both effects produced a desirably warm and lively sound with a natural enhancement of harmonics, despite the lack of sophisticated tone controls in early amplifiers.

Early amplifier designers could not be certain how much voltage would be produced by the various types of guitars available, and each tube stage adds a large increment of gain. Therefore it was common for early amplifiers to have considerably more gain than required for undistorted operation. It was empirically discovered by guitar players that this "excess gain" could be used to add extra loudness, sustain, and harmonics to their sound by intentionally driving their amplifier into clipping. The exploitation of such "overdrive" has become a large part of the tonal range associated with the electric guitar, especially when used in high-energy music.

Although certain details of tube-circuit design were empirically optimized for the playing of electric guitar, it was largely fortuitous that amplifier tubes developed for general purpose audio reproduction proved to have musically valuable properties in guitar amps. As a result, certain dynamic behaviors typical of tube amps, and incorporated into the tradition of electric guitar performance, have been taken for granted, and are not well recognized by amplifier designers. When the industry began a shift to solid-state amplifiers for well-known reasons of cost, efficiency, weight reduction, and component lifetime, more exacting musicians were not satisfied by the resulting performance, because dynamic behaviors of tube amplifiers were missing. Therefore, discerning musicians continue to prefer tube amplifiers as having better tone and dynamic "feel", despite their well-known drawbacks of high cost, weight, fragility, and increasingly hard-to-obtain vacuum tubes.

Solid-state amplifiers suffer from some first-order drawbacks which have been recognized and partially corrected. One obvious problem is that typical bipolar-type transistors are inherently low-impedance devices which do not mate well with high-impedance pickups. The development of low-power FET input devices, and particularly, FET-based operational amplifiers, can provide the high impedance inputs for solid-state amplifiers that allow the guitar pickup to develop its full frequency range. It is now also common to provide means for controllable overdrive clipping, sometimes with a soft clipping knee, and thus, allowing the musician to transition from the undistorted or "clean" range into overdrive as a function of their volume settings and playing attack. Even with controllable overdrive clipping, solid-state-amplifiers are still considered cold and brittle. In response, various controls have been added to conventional amplifiers that expand the possibilities of sound shaping and add special effects. For example, some devices have added audio transformers (as required in tube amplifiers), or a small-signal tube in the pre-amplifier section of the solid-state amplifier in the belief the additions would provide the missing warmth and tonal qualities of conventional tube-amplifiers. However, even with these undesirable complications, solid-state amps are still considered to be relatively cold, unresponsive, and forced-sounding, in contrast to the warmth, liveliness, and natural "feel" of well-designed tube amps.

More recently, a major effort has been made to use the power of digital signal processing (DSP) to reproduce the dynamics and tonal qualities of tube-amplifiers missing from standard solid-state amplifiers. The industry provides "modeling amps" that purport to reproduce the sounds of various "tone standards" typically associated with well-regarded tube amplifiers. It is generally observed that such schemes are moderately successful for certain defined playing styles and loudness levels, but still fail to reproduce the actual dynamic behavior of the original amplifiers, and therefore, lack the desired "feel" and artistic satisfaction. Furthermore, for practical reasons, such schemes are typically incorporated in otherwise conventional solid-state amps, which still suffer from the afore-mentioned qualities of coldness and brittleness. Similarly, attempts to apply current and voltage feedback in varying proportions to a standard linear amplifier, thus providing a higher output impedance that enhances the sound of the speaker, may still result in clipping which is undesirably harsh and such amps have not been combined advantageously with other desirable processing as described above. The most common and commercially supported topologies present a low impedance voltage source to the speaker with the tonal drawbacks noted above.

Thus, there exists a desire for an amplifier and method with improved harmonic response and which overcomes one or more of the aforementioned drawbacks.

BRIEF SUMMARY OF THE EMBODIMENTS

Disclosed and claimed herein are a device and methods for amplifying a signal. In one embodiment, an amplifier includes an input configured to receive a signal, and an overdrive shaping circuit electrically coupled to the input and configured to receive the input signal, the overdrive shaping circuit including one or more elements for harmonic shaping of the signal. The amplifier also includes a power amplifier circuit electrically coupled to the overdrive shaping circuit, the power amplifier circuit configured to receive a harmonic shaped signal from the overdrive shaping circuit, wherein the power amplifier circuit includes a switchmode amplifier to amplify the harmonic shaped signal and means to increase the output impedance of the switchmode amplifier. The amplifier also includes an output coupled to the power amplifier circuit, the output configured to output a signal amplified by the switchmode amplifier.

In another embodiment, a guitar amplifier is provided including an input configured to receive a signal, and an overdrive shaping circuit electrically coupled to the input and configured to receive the input signal, the overdrive shaping circuit including a soft clipping cell, sag controller, zero-crossing processor and even harmonic generator for harmonic shaping of the signal. The guitar amplifier also includes a power amplifier circuit electrically coupled to the overdrive shaping circuit, the power amplifier circuit configured to receive a harmonic shaped signal from the overdrive shaping circuit, wherein the power amplifier circuit includes a switchmode amplifier to amplify the harmonic shaped signal, and includes one or more elements to increase the output impedance of the switchmode amplifier. The guitar amplifier also includes an output coupled to the power amplifier circuit, the output configured to output a signal amplified by the switchmode amplifier.

Other aspects, features, and techniques will be apparent to one skilled in the relevant art in view of the following detailed description of the embodiments.

BRIEF DESCRIPTION OF THE DRAWINGS

The features, objects, and advantages of the present disclosure will become more apparent from the detailed description set forth below when taken in conjunction with the drawings in which like reference characters identify correspondingly throughout and wherein.

DETAILED DESCRIPTION OF THE EXEMPLARY EMBODIMENTS

Overview and Terminology

Figure 1:
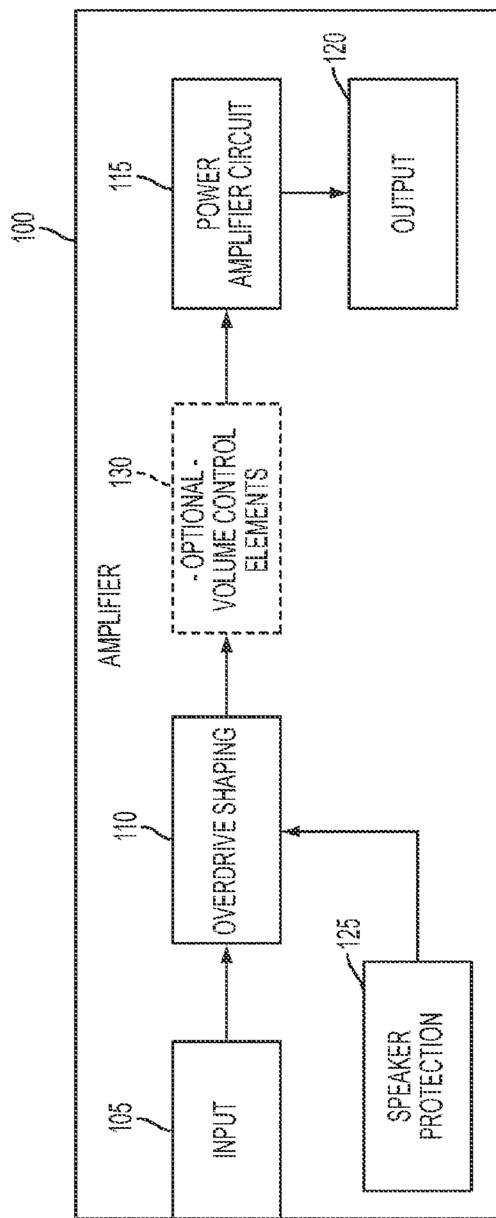
FIG. 1 depicts a simplified block diagram of an amplifier according to one or more embodiments.

One aspect of the disclosure relates to providing an amplifier with improved harmonic response. A device and methods are provided for amplifying sound signals by one or more circuit components, wherein the one or more circuit components exhibit the dynamic behavior and characteristics associated with well-regarded tube amplifiers. According to one embodiment, an amplifier and methods as described herein, provide the dynamic behavior associated with tube-amplifiers, without relying on vacuum tubes. In contrast to conventional solid-state amplifiers, an amplifier according to one or more embodiments described herein can drive a speaker to resonate freely, and the amplifier can overcome the effects of an inductive input at high frequencies.

One embodiment of the disclosure is directed to an amplifier that has the same desirable dynamic behaviors as archetypal tube amps, with the addition of increased controllability, higher output power, lighter weight, and smaller cabinet size. Dynamic behaviors of tube amps may be provided based on an amplifier comprising low-power analog circuitry, the circuitry controlled to behave in a similar manner to a typical tube amplifier, and high efficiency power circuitry, such as a switchmode amplifier. By way of example, the amplifier described herein may be configured to provide one or more of compression for greater sustain, dynamic behavior, dynamic frequency response and distortion.

Another aspect of the disclosure is directed to providing well-controlled overdrive with a predictable transition from clean to overdrive, and with musically desirable overdrive harmonics. In one embodiment, amplifiers and methods of amplifying sound described herein may beneficially provide an overdrive at loud and soft levels as desired by the user. Another benefit may be enhanced clarity in both the clean and overdrive regions, with good preservation of chord structure in overdrive. Another benefit may be providing an amplifier with warmth commonly associated with tube amplifiers. Moreover, these desirable attributes may be provided in a product with the advantages of reduced size and weight, and increased efficiency and component availability. Further, the amplifier and methods described herein may readily be combined with audio effects and user controls, without relying on vacuum tube technology.

As used herein, the terms "a" or "an" shall mean one or more than one. The term "plurality" shall mean two or more than two. The term "another" is defined as a second or more. The terms "including" and/or "having" are open ended (e.g., comprising). The term "or" as used herein is to be interpreted as inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

Reference throughout this document to "one embodiment," "certain embodiments," "an embodiment," or similar term means that a particular feature, structure, or characteristic described in connection with the embodiment is included in at least one embodiment. Thus, the appearances of such phrases in various places throughout this specification are not necessarily all referring to the same embodiment. Furthermore, the particular features, structures, or characteristics may be combined in any suitable manner on one or more embodiments without limitation.

In accordance with the practices of persons skilled in the art of computer programming, one or more embodiments are described below with reference to operations that are performed by a computer system or a like electronic system. Such operations are sometimes referred to as being computer-executed. It will be appreciated that operations that are symbolically represented include the manipulation by a processor, such as a central processing unit, of electrical signals representing data bits and the maintenance of data bits at memory locations, such as in system memory, as well as other processing of signals. The memory locations where data bits are maintained are physical locations that have particular electrical, magnetic, optical, or organic properties corresponding to the data bits.

When implemented in software, the elements of the embodiments are essentially the code segments to perform the necessary tasks. The code segments can be stored in a processor readable medium, which may include any medium that can store or transfer information. Examples of the processor readable mediums include an electronic circuit, a semiconductor memory device, a read-only memory (ROM), a flash memory or other non-volatile memory, a floppy diskette, a CD-ROM, an optical disk, a hard disk, a non-transitory medium, etc.

Exemplary Embodiments

Referring now to the figures, FIG. 1 depicts a simplified block diagram of an amplifier according to one or more embodiments. According to one embodiment, amplifier 100 may provide an improved harmonic response based on one or more of an overdrive processing section, a switchmode amplifier, and thermal speaker protection. As depicted in FIG. 1, amplifier 100 includes input 105, overdrive shaping elements 110, power amplifier circuit 115, output 120 and speaker protection 125. Input 105 may be one or more terminals (e.g., stereo jack, XLR, etc.) for receiving one or more sound channels. Input 105 may be configured to receive signals from a musical instrument, such as a guitar (e.g., electric guitar) or other device with one or more pickups. Overdrive shaping elements 110 are electrically coupled to input 110 and configured to receive input signals.

In on embodiment, output 120 may include one or more drivers (e.g., speakers) including but not limited to an internal speaker and an external speaker for output of sound. According to another embodiment, output 120 may include one or more terminals (e.g., stereo jack, XLR, etc.) for coupling power amplifier circuit 115 to one or more of a external speaker, cable, sound driver, speaker assembly or other device. In certain embodiments, amplifier 100 may include optional volume control elements 130 as will be described below in more detail with respect to FIG. 3. It should also be appreciated that output 120 may provide more than one output channel.

Amplifier 100 may be configured to exhibit one or more properties of a well-regarded tube amplifier. The natural properties of a well-regarded tube amplifier depend heavily on fortuitous properties of commonly used push-pull output sections. For example, tube amplifiers clip rather gradually, so that the increased harmonics associated with clipping set in gradually, favoring the lower overtones, for a more pleasing musical effect. Another well-regarded property is that the output impedance of guitar tube amplifiers is rather high, especially compared to typical closed-loop voltage-feedback amps, such that their behavior into actual inductive speakers is much different than into a commonly used resistive bench load, with much additional voltage overshoot and extra voltage swing in regions where the speaker impedance is high. Other properties of tube amplifiers include: the bias point of the power tubes varies dynamically as a result of overdrive; the peak voltage of a clipped signal sags somewhat at high outputs; and clipped waveforms deviate from perfect symmetry under heavy overdrive due to non-symmetrical clipping of preceding tube stages. Most of these effects/properties would be regarded by a conventional amplifier designer as defects to be eliminated. Yet these properties all contribute to the dynamic response desired by guitar players. It is the object of this disclosure to emulate and produce desirable properties of tube amps, and minimize undesirable effects, by designing circuitry that reproduces these behaviors in a controlled manner. In certain embodiments, amplifier 100 may be configured to emulate characteristics of a particular tube amplifier that is considered to have a desired response, such as an amplifier produced by a particular company during a particular time period. It should also be appreciated that amplifier 100 may be configured to allow for a user to select one or more characteristics of sound and/or particular well-regarded tube amplifier characteristics.

According to one embodiment, overdrive shaping elements 110 may include one or more elements configured to provide desirable harmonic shaping and a dynamic response. Overdrive shaping elements 110 may be a circuit including a plurality of elements which exhibit a dynamic range of smooth and warm overdrive tones associated with well-regarded or vintage tube amplifiers. Overdrive elements 110 may include one or more of a soft clipping cell, sag controller, zero crossing processor, and even harmonic generator. Overdrive elements 110 may provide harmonic shaping by providing a dynamic range of overdrive tones associated with a tube amplifier.

Power amplifier circuit 115 is electrically coupled to overdrive shaping elements 110 and is configured to receive a harmonic shaped signal from the overdrive shaping circuit. Power amplifier circuit 115 may include one of a switchmode amplifier, PWM (pulse width modulated) amplifier and Class-D amplifier. A switchmode amplifier, as used herein, uses a received input signal (e.g., sound signal) to modulate a PWM carrier signal which drives the output. During operation of a switchmode amplifier, switches of the amplifier circuit are either fully on or fully off, and, thus, the power losses to output devices are significantly reduced. Efficiencies of a switchmode amplifier may theoretically approach 100%. A switchmode amplifier of power amplifier circuit 115 can be as high as 90% efficient. In contrast, the inherently low efficiency of a linear amplifier typically falls well below 70% efficiency. Power amplifier circuit 115 may be configured with a high output impedance to improve speaker tone, and with sufficient peak power to reproduce the shaped clipping harmonics without clipping.

Power amplifier circuit 115 may additionally be configured with extra voltage swing at frequencies where the speaker impedance is high. According to one embodiment, power amplifier circuit 115 employs a switchmode technique to provide extra voltage swing at frequencies where the speaker impedance is high. Typical dynamic speakers benefit from up to 6 dB of extra voltage swing to provide full power at impedance peaks, whereas tube amps provide about 3 dB of such extra voltage, and linear solid-state amps almost none. In contrast, switchmode amplifiers are advantageous in this case, as there is only a slight efficiency loss during partial power operation. For example, a 400 watt switchmode amplifier may typically supply 100 watts, but may have extra headroom to supply 100% more output voltage at high impedance points. Such extra voltage swing would be costly to provide using a linear amplifier, as the inherent losses of a 400 watt linear amplifier operated at a partial power of 100 watts are several times greater than a "normally sized" 100 watt linear amplifier operated at this same power. Some of these same losses are typically incurred in tube amplifier designs due to their high internal resistance, plus losses associated with filament heating. By way of example, representative losses for each type of amplifier supplying 100 watts with up to 100% (6 dB) more voltage swing at high impedances will typically be: tube design, 150-200 watts loss, linear solid-state approx. 100 watts loss, and switchmode, 10-20 watts loss. These losses equate to waste heat that must be removed by using a large and well-ventilated chassis in the case of tube amps, special heat dissipaters in a linear solid-state amplifier, but which may be readily dissipated by a thermally conductive housing such as a compact aluminum chassis in a switchmode amplifier.

Amplifier 100 may be configured to provide and/or exhibit one or more desirable features, such as well-regarded features associated with tube amplifiers, based on operation and configuration of overdrive shaping element 110 and power amplifier circuit 115. In particular, amplifier 100 may be configured to provide a desired level of tone, dynamic response and warmth that is not provided for by conventional solid-state amplifiers. In addition, the configuration of amplifier 100 may overcome one or more drawbacks of conventional guitar amplifiers, and in particular vacuum tube amplifiers.

Classic tube amps, especially those having an "open loop" design with no global feedback, present a current source rather than a voltage source to the loudspeaker. This allows natural tone of a speaker to manifest more strongly. Commercially available power tubes are sufficiently linear and predictable that they can be used, with some care, in open-loop designs, and the moderate amounts of low-order residual distortion that may remain add the desirable quality of warmth. In addition, vacuum tubes and their associated coupling transformers add considerable resistance in series with the output signal, which degrades efficiency but manifests itself as an ability to deliver extra voltage swing at frequencies where the speaker impedance is high.

In contrast, power transistors have very low saturation resistance, which improves efficiency by coupling more of the power supply voltage directly to the speaker. However, conventional power transistors produce abrupt and flat-topped clipping with no further voltage swing even into reactive loads. Transistors are also much less linear, and amplifiers designed for high fidelity or general purpose use almost always use large amounts of voltage feedback to greatly reduce non-linear errors; which also has the effect of presenting a low impedance voltage source to the speaker. Presenting a low impedance source to a speaker, by an amplifier, dampens the natural imperfections of the speaker, and thus, improves fidelity in the general case, but produces a sterile quality for guitar use. Such as result is undesirable. Further, speakers designed for guitar amps have definite tonal properties that are intended to be part of the sound. Coupling such speakers to a low impedance voltage-source amplifier tends to suppress their tone, and corrective equalization sounds artificial. In contrast, a current source amplifier allows the speaker to resonate freely, and also overcomes the effects of inductance at high frequencies, thus producing a richer and brighter sound.

According to one embodiment, power amplifier circuit 115 may employ PWM or Class-D amplification to provide much higher efficiency than linear amplifiers, whether tube or solid-state. As such, embodiments described herein may have more power provided in a smaller, lighter package with the additional benefits of reduced energy consumption. For power amplifier circuit 115, satisfactory error correction and linearity can be obtained based on voltage feedback taken from certain advantageous points of amplifier 100.

According to another embodiment, when power amplifier circuit 115 is incorporated in a common chassis with sampled subsystems such as digital effects processors, it is often desired to synchronize the switching frequency of the power amplifier with a multiple or sub-multiple of the digital processor clock, to prevent unwanted beat frequencies from developing. For this reason, power amplifier circuit 115 may be configured to operate based on a fixed frequency, rather than a self-oscillating frequency. It should be appreciated that the general principles described herein may be applied to self-oscillating schemes, allowing for possible issues of increased noise or beat tones. In one exemplary embodiment, power amplifier circuit 115 may operate based on a fixed frequency within the range of 150 kHz to 500 kHz. The range of power amplifier circuit 115 may provide a tradeoff of high frequency quality at the lower range against higher switching loss at the higher range. According to one exemplary embodiment, a 250 kHz frequency range can be quite satisfactory in practice.

Speaker thermal protection 125 protects against thermal runaway that could result from excessively prolonged peak power output. The combination of current feedback and the consequent approximation of a current source by amplifier 110, with amplifier 100 having extra voltage swing, has a further effect on speaker performance that requires additional protection. Ordinarily, as a speaker is driven to full power, the power dissipated in the voice coil windings increases the temperature of the windings, and due to the temperature coefficient of the conductors, their resistance increases by 50% or more. This added resistance, when coupled to a voltage source amplifier, automatically reduces the power drawn by the speaker, and is termed "thermal compression." Due to thermal compression, the speaker output level is undesirably reduced, but the speaker tends to self-limit its power draw during extreme overload, and thus its temperature rise is somewhat limited.

A current source amplifier tends to maintain the same current regardless of voice coil resistance. Therefore, the power dissipated in a speaker actually increases as its impedance rises, rather than limiting itself, which can lead to thermal runaway and destruction of the voice coil. A guitar amplifier with a high peak output level rarely needs to be used at its maximum power, but is still expected to survive if it is necessary to do so. Increasing the speaker capacity to absorb this occasional peak usage would add cost and weight. Therefore it is more advantageous to add a low cost circuit, such as speaker protection circuit 125, to detect the effects of excessive voice coil temperatures and imperceptibly reduce the peak output power to limit speaker temperature to a safe value.

Given the ability to establish the preamp clipping level and the closed-loop power amplifier gain by amplifier 100, the peak voltage across the speaker at its maximum desired power, with the voice coil of a driver at a normal temperature, can be measured and a threshold set slightly above the peak voltage point. According to one embodiment, when the output swing exceeds the peak voltage point, it is assumed to be caused by rising voice coil impedance due to excessive temperature rise. Exceeding this threshold should most advantageously result in increasing the amount of sag in the clipping circuit. According to another embodiment, increasing the sag reliably limits the voltage swing without reducing the sensation of overdrive, and this action tends not to occur on clean signals with a lower peak voltage, thus intervening by the minimum amount possible and preserving the maximum impression of dynamics.

In other embodiments, amplifier 100 may include one or more additional features, such as multiple input channels, tone controls, special effects, and switchable settings. Amplifier 100 may be configured to operate in a low-power, low-voltage domain ranging from less than 5 volts to +/−15 volts, and therefore, tone shaping as discussed herein can operate at compatible voltages and currents.

According to one embodiment, amplifier 100 may be a guitar amplifier with a small-signal clipping cell (e.g., clipping cell 220 of FIG. 2) having a peak clipping level that sags in response to defined overdrive levels, with a time constant that corresponds to typical musical performance tempos, which can range from 70 to 150 beats per minute, with typical rapid sequences occurring at a rate of 2 to 10 notes per second. An appropriate time constant in this case could be about ½ second. The clipping cell of amplifier 100 can use the combination of a current-steering diode bridge with a fixed resistive load, and a current source that is caused to sag in response to defined overdrive levels. The guitar amplifier may also include a combination of a clipping cell and a zero-crossing processing cell. In one embodiment, the zero-crossing processing cell uses positive and negative current sources that maintain a charge on positive and negative capacitors, that are coupled to adjoining positive and negative diodes, that are thereby forward biased to ordinarily maintain signal continuity, but when driven beyond a defined level, are subject to rectified currents that change the capacitor voltages, causing the diodes to become reverse biased at low voltages and thus blank the central portion of the signal, with a time constant that is aligned to typical performance tempos. In another embodiment, the small-signal zero-crossing processing cell may be configured to pass low-level signals intact, but develops a gap at the zero-crossing point in response to signals above a defined threshold, with a time constant that is aligned to typical performance tempos.

In another embodiment, amplifier 100 may be a guitar amplifier with means of producing even order harmonic distortion of a controlled amount at a threshold aligned with or slightly above the clipping threshold of an associated clipping scheme. The even order harmonic distortion generator may include a diode and series resistor added to the resistive feedback loop of a linear amplifier stage, adjusted to produce an asymmetrical positive and negative gain above a threshold that is aligned to a clipping system. The amplifier may include a combination of a clipping cell, zero-crossing processor, and even harmonic generator. The activation and adjustment of amplifier 100 can be controllable by a user. As individual effects of amplifier 100 may be hard to discern by untrained users, certain combinations and degrees of action may be combined in some embodiments into "presets" that represent certain familiar tone qualities and/or musical styles.

In another embodiment, amplifier 100 may be a guitar amplifier including a switchmode amplifier, with a combination of voltage and current feedback, so as to produce an output impedance substantially higher than the attached loudspeaker, thus acting substantially as a current source into said speaker, with a sufficient peak output voltage to support the extra voltage swing that occurs at impedance peaks without reaching its own clipping limits. The switchmode amplifier may perform modulation by an integrator that sums voltage feedback from the switching voltage, a square-wave clock input, and an audio signal input, to obtain fixed frequency operation with internal error correction. The switchmode amplifier may include an additional error correction amplifier prior to the modulator section which receives a feedback signal from a current sensing element that adds approximately 12 dB of additional current feedback. The switchmode amplifier may also automatically change a feedback ratio based upon the connection of an additional parallel speaker to provide a substantially equal or greater total power to the parallel loads. The switchmode amplifier may include a current sensing element, such as a small-value resistor, placed between circuit ground and the return lead of the speaker. The switchmode amplifier can include an output filter capacitor connected between the output of the amplifier and the current sensing resistor in order to add phase lead to the current sensing signal.

In another embodiment, amplifier 100 may relate to a guitar amplifier with a speaker protection scheme that senses the increase of voltage across the speaker terminals due to an increase in the resistive component of the voice coil impedance, and uses this condition to reduce the peak voltage sent to the speaker to keep it within a determined limit. The speaker protection scheme can reduce the threshold of clipping in order to restrain the applied voltage to the speaker. The speaker protection system may be combined with a high output voltage switchmode amplifier, and/or variable-sag distortion system. In certain embodiments, amplifier 100 can include an output monitor coupled to power amplifier circuit 115, the monitor configured to limit the output signal of a switchmode amplifier.

Although amplifier 100 has been described above in connection with a guitar, it should be appreciated that amplifier 100 may operate for one or more of an electric guitar, stringed instrument, and other musical instruments in general.

Figure 2:
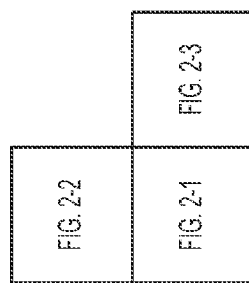
FIG. 2 depicts a guitar amplifier according to one or more embodiments.
Figures 1, 2:
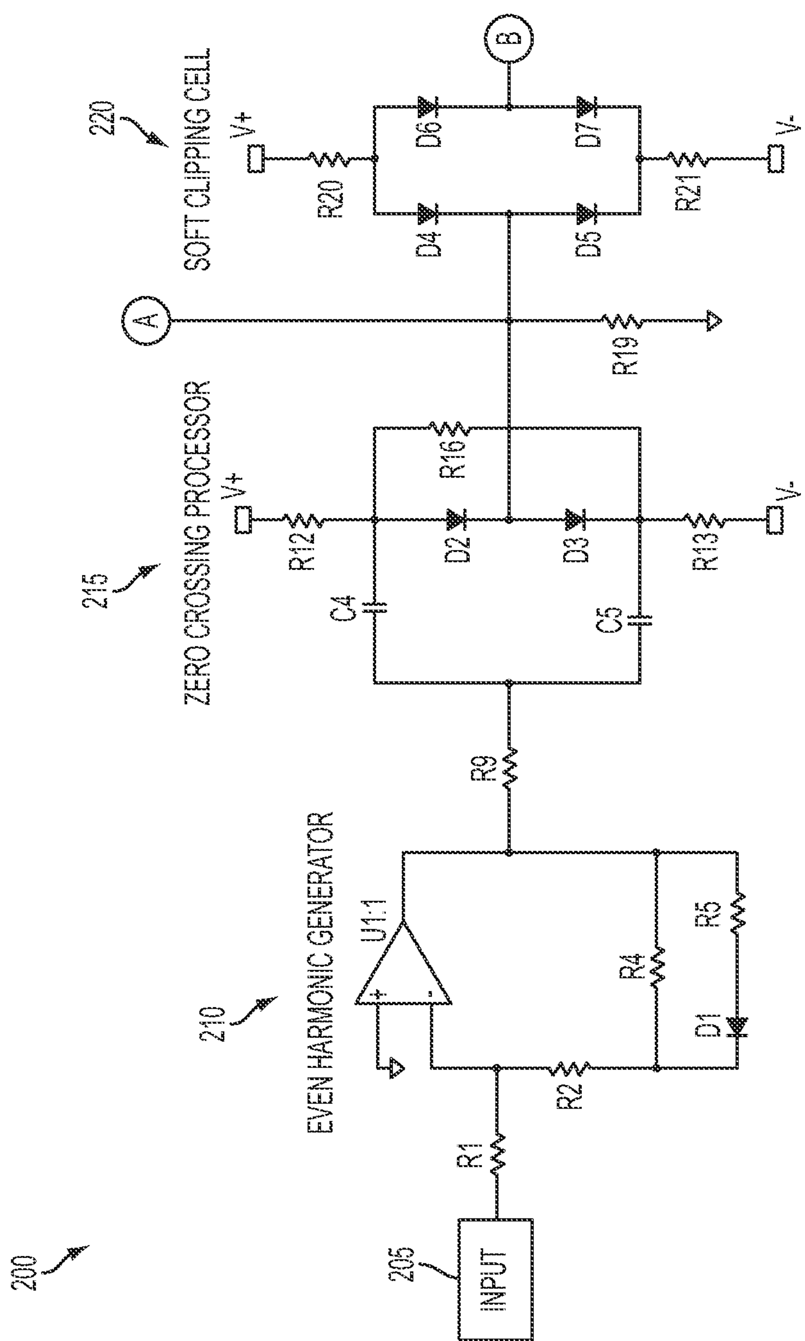
Figure 2:
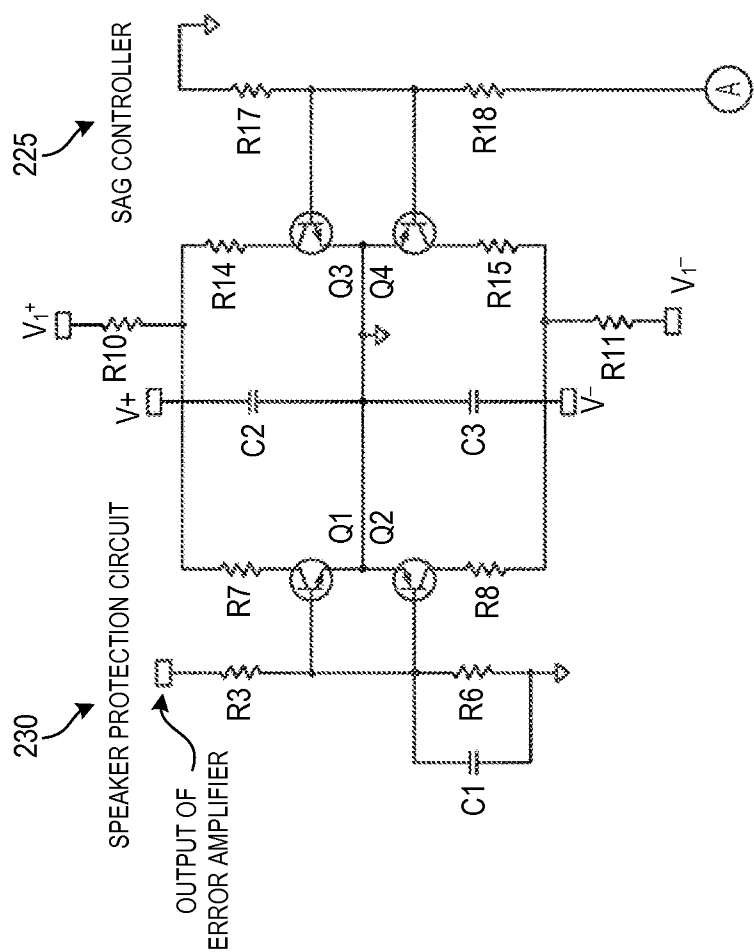

Referring now to FIG. 2, amplifier 200 is depicted according to one or more embodiments. Amplifier 200 may relate to an exemplary circuit diagram for the amplifier of FIG. 1. According to one embodiment, amplifier 200 may include one or more of overdrive shaping elements, a switchmode amplifier, and speaker thermal protection. As depicted in FIG. 2, amplifier 200 includes input 205 which may be configured to receive one or more sound signals, such as the output of an electric guitar, an instrument, sound signal input, etc.

I. Overdrive Shaping

According to one embodiment, overdrive shaping may emulate one or more properties of a tube amplifier. Overdrive shaping may be performed based on one or more of even harmonic generator 210, zero crossing processor 215, soft clipping cell 220 and sag controller 225.

Soft Clipping Cell

Overdrive shaping includes a small-signal soft clipping cell 220 configured to have a peak clipping level that sags in response to defined overdrive levels, with a time constant that corresponds to typical musical performance tempos. The soft clipping cell 220 includes a current-steering diode bridge with a fixed resistive load and a current source configured to sag in response to defined overdrive levels. As depicted in FIG. 2, soft clipping cell 220 comprises four small-signal diodes D4, D5, D6, and D7, arranged in a current-steering bridge, driven by any convenient full-scale signal source such as U1:1, which may be an operational amplifier (e.g., opamp) or discrete amplifier stage with an output impedance substantially lower than load resistor R22. The bridge is supplied by current sources via resistances R20, R21 and loaded with a known resistance R22, which thus limits the maximum possible signal swing to a defined clipping voltage, and has further advantageous properties that form part of the system. In particular, soft clipping cell 220 clips gradually, without abrupt artifacts, and resistances R20/R21 and R22 can be scaled to adjust peak voltage and abruptness of clipping. Soft clipping cell 220 can provide a gradual rise of distortion prior to actual clipping to allow the performer and listener to anticipate the onset of clipping and thus, control the transition to better effect. Adjusting the clipping threshold to change the harmonic distortion, as measured 3 dB below the point of clipping, from 0.1% to 5% covers the range from a high fidelity sound quality to the rather blurry quality associated with the most primitive amplifiers.

Sag Controller

The overdrive shaping circuit of amplifier 200 includes a sag controller circuit 225 configured to produce a controllable amount of sag for a clipping voltage level. Soft clipping cell 220 by itself produces moderately satisfying results but may only incorporate the first of the numerous behaviors noted above, (i.e., soft clipping). When fully overdriven, soft clipping cell 220 produces a square wave with twice the power of the maximum unclipped signal. It is desirable for the maximum clean sound and the overdrive sound to be more closely matched, and fortuitously, vintage tube amplifiers have power supplies that sag under the extra load imposed by overdrive, reducing the overdrive power. To produce this effect in a controlled manner, sag controller 225 comprising divider R17, R18, transistors Q3, Q4, and current scaling resistors R14, R15, depletes the voltages on C2, C3 by a controllable amount, determined by the ratio of R10/R14 and R11/R15, when the audio signal is sufficient to trigger Q3, Q4. The current sources for the clipping cell R20, R21 being connected to C2, C3, thus produces a controllable amount of sag in the clipping voltage, which may be adjusted to balance the relative loudness of the maximum clean level and the overdrive level, thus enabling the performer to use the musical excitement of overdrive without undue stress on the loudspeaker or the listener's ears. The time constant and depth of the sag is adjustable and can be set to correspond to the dynamics of the plucked string or typical playing tempos.

Zero Crossing Processor

The overdrive shaping circuit includes zero-crossing processor circuit 215 configured to pass low-level signals intact, and develop a gap at the zero-crossing point in response to signals above a defined threshold, with a time constant that is aligned to typical performance tempos. The zero-crossing processor circuit 215 uses positive and negative current sources that maintain a charge on positive and negative capacitors, that are coupled to adjoining positive and negative diodes, that are thereby forward biased to ordinarily maintain signal continuity, but when driven beyond a defined level, are subject to rectified currents that change the capacitor voltages, causing the diodes to become reverse biased at low voltages and thus blank the central portion of the signal, with a time constant that is aligned to typical performance tempos.

Typical tube amps have a push-pull output section comprising an R-C coupled phase inverter that provides an equal but out-of-phase signal to each of the power tubes to produce the desired push-pull amplification into a center-tapped output transformer. The bias point of the power tubes is typically held in Class-A or Class-AB operation by high value resistors coupled either to a negative bias supply or to ground with the use of a cathode resistor. In either case, a relatively low-impedance signal from the phase inverter is capacitively coupled to the input grids. When driven to clipping, these grids rectify the input current, which alters the voltage on the coupling capacitors so as to drive the output tubes into Class-C operation, creating a significant zone around the zero crossing point where neither tube is conductive. This results in several effects: a new threshold of distortion occurs around the zero-crossing point, which adds sizzle and richness to the basic sound of clipping, the central portion of the signal swing is blanked, so that the remaining signal contains more of the input signal's envelope, and thus, preserves more of the chord structure; and this blanking persists for a short time after the overdriven note ends, while the bias is returning to normal, as determined by the R-C time constant of the coupling capacitors and the grid bias resistors, helping the guitarist achieve a crisp separation of notes during rapid overdrive passages. These several effects contribute to the "feel and definition" ascribed to tube-based amplifiers, and it will be appreciated that the effect is created at the final output stage, where it is inconvenient to adjust the point of clipping or add any further effects.

The above-identified effects are emulated by a zero crossing processor 215 which works in combination with the preceding linear stage (e.g., even harmonic generator 210), and the soft-clipping cell 220, to produce the full dynamic behavior that characterizes a classic tube amplifier. It should be further noted that the various low-power component values can readily be adjusted to enhance or diminish the various elements of this complex clipping behavior for interesting musical effects, rather than being constrained by practical considerations to the rather narrow range of values found in classic tube designs.

In one embodiment, R12 and R13 of zero crossing processor 215 form positive and negative current sources that maintain a charge on positive and negative capacitors C4 and C5, that forward bias adjoining positive and negative diodes D2 and D3, thus normally maintaining signal continuity through this network. When driven beyond a defined level, the load presented by R19 draws unbalanced rectified currents though each of diodes D2 and D3, which alter the capacitor voltages C4 and C5, causing diodes D2 and D3 to become reverse biased over part of the signal swing, and thus, blank the central portion of the signal. The values of C4, C5 and current sources R12, R13 establish a recovery time constant that is preferentially aligned to typical performance tempos.

Even Harmonic Generator

The clipping sections of amplifier 200 presented thus far are all substantially symmetrical in their behavior, and thus, produce primarily odd-order harmonics in varying amounts. However, natural musical instruments have a desirable blend of odd and even order harmonics.

The overdrive shaping circuit includes even harmonic generator circuit 210 configured to produce even order harmonic distortion of a controlled amount, at a threshold aligned with or slightly above the clipping threshold of a clipping voltage. The even harmonic generator circuit 210 includes a diode D1 and series resistor R5 added to the resistive feedback loop of a linear amplifier stage, adjusted to produce an asymmetrical positive and negative gain above a threshold that is aligned to a clipping system.

Even harmonic generator 210 introduces an intentional asymmetry in an incoming signal by adding D1 and R5 in parallel with R4 in a feedback network, which creates even order harmonics when the signal level is large enough to produce clipping in the following section. Even harmonic generator 210 adds an additional layer of tonal color to the overdrive harmonics without adding distortion in the region below clipping. The production of even and odd order overdrive harmonics at various depths of overdrive is a fortuitous property of classic tube amps, typically not highly controlled by the designer as such. In this invention we can readily manipulate the various component values to balance the odd and even harmonics, thus adding a new level of interest to the basic sound of the overdrive.

The result of the overdrive processing system of FIG. 2, combined with equalization, switchable presets, and effects enhancements that may be provided by optional volume control elements 130 of FIG. 1, provides greatly expanded dynamic response and tonal resources to a musician. According to one embodiment, it will be appreciated that the output of the overdrive processing system is an electronic signal that can be controlled with a standard potentiometer, herein referred to as a master volume control, to produce its effect at any volume level, up to a limit imposed by the clipping level of the final power amplifier. The master volume control can is located between overdrive shaping circuit 110 and power amplifier circuit 115 of FIG. 1. In FIG. 2, the master volume control may be located between buffer 245 and resistance R23, the input to the amplifier block, or buffer 245 may itself be considered as a variable gain block. It will be further appreciated that equalization may be provided after the overdrive processing system for overall tonal modification, and insert connections added for the patching of external effects, thus providing for versatility of tone not possible by overdriving any particular amplifier into any particular speaker, as long as the processed signal remains within the unclipped limits of the final power amplifier. Thus, according to one embodiment, an optimized power amplifier is provided for fully satisfactory results.

II. Switchmode Amplifier

According to one embodiment, amplifier 200 may include a power amplifier circuit including switchmode amplifier 235. Switchmode amplifier 235 may be configured with a high output impedance and extra voltage swing according to one or more embodiments. Switchmode amplifier 235 can produce an output impedance substantially higher than the output (e.g., speaker, attached load, etc.), and to act as a as a current source into the output, with a sufficient peak output voltage to support the extra voltage swing that occurs at impedance peaks without reaching clipping limits of the switchmode amplifier. Switchmode amplifier 235 can also provide gradual clipping.

Switchmode amplifier 235 may be one component of a power amplifier circuit of amplifier 200. According to one embodiment, a power amplifier stage of amplifier 200 may include one or more of switchmode amplified 235, buffer 245, and error amplifier 250. A power amplifier circuit includes an integrator configured to provide modulation for switchmode amplifier 235 by summing voltage feedback from switching voltage, a square-wave clock input 236, and an audio signal input, to obtain fixed frequency operation with internal error correction.

Switchmode amplifier 235 may be configured with a combination of voltage and current feedback, so as to produce an output impedance substantially higher than an attached loudspeaker, speaker cabinet or output device. As a result, the switchmode amplifier will act as a current source into the output/speaker, with a sufficient peak output voltage to support the extra voltage swing that occurs at impedance peaks without reaching its own clipping limits.

By way of example, due to phase shift of an L-C output filter 243 (e.g., L1 and C12 of FIG. 2), which couples output of switchmode amplifier 235 to a load/output, it is advantageous to take local voltage feedback just prior to the output filter as identified by 244 according to one embodiment. Voltage feedback loop 246 can reduce errors except those of the output filter, which are predictable. In addition, a certain amount of current feedback may be added in order to produce a desirably higher output impedance and also provide better interaction with the speaker. Current feedback loop 247 may be employed to superpose additional current feedback (e.g., about 12 dB) which creates an output impedance roughly three times that of the intended load, and which approximates the results of driving speaker 255 with a current source while limiting the voltage rise of an open load to +12 dB, preventing dangerously high overshoots.

As depicted in FIG. 2, switchmode amplifier 235 includes gate driver 240, switch 241, and switch 242. Gate driver 240 is configured to drive switching transistors 241 and 242 to switch in alternation to positive and negative high voltage levels of a pulse-width modulated (PWM) signal.

In one embodiment, the switching frequency of the switchmode amplifier 235 is established by a clock generator circuit block 236, which may be a 250 KHZ clock generator with 0-5V rails, using any convenient means, such as a standard 5V CMOS logic circuit that combines a crystal controlled oscillator with suitable frequency division to provide a stable 250 kHz square wave switching between 0 and 5V. Block 236 is coupled via R31 and C10 into integrating capacitor C11, which is scaled to convert the clocks square wave into a triangle wave switching slightly above and below ground, for example, +/−250 mv peak. Comparator U3:1 detects the zero crossings of this triangle wave and produces a switched output signal at this frequency. The triangle waveform is driven relatively slowly above and below ground by summing in the audio-frequency signal via R29 and C10, resulting in a corresponding change in the timing of the zero crossing intersections, which produces a variable pulse width with an on/off ratio that is proportional to the audio amplitude. This PWM signal is coupled via gate driver 240, to the gates of switching transistors 241 and 242 (e.g., Q5, Q6), which switch in alternation to the positive and negative high voltage rails, as commanded by the PWM signal. An output filter comprising L1 and C12 passes the average voltage of these high/low switching pulses to the speaker over the audio frequency range, while integrating and smoothing the switching frequency, thus producing a high voltage, highly amplified replica of the input signal without the usual losses of a high voltage linear amplifier. Error correction and DC centering of the output is provided by taking negative feedback from the switching voltage via R32 back to the same integrating capacitor C11.

Switchmode amplifier 235 can provide acceptable reproduction, but naturally presents a low output impedance to the speaker. Superimposing additional negative feedback developed from the output current, preferably in the range of an additional 12 dB, will cause the output impedance to rise to several times that of the intended load impedance, thus approximating a current source and allowing the speaker tone to manifest itself more fully.

Error amplifier 250 is an error correction amplifier configured to receive a feedback signal from a current sensing element that provides additional current feedback. Current feedback ratio can be automatically changed upon the connection of an additional parallel speaker to provide a substantially equal or greater total power to the parallel loads. The current sensing element is a small-value resistor R36 placed between circuit ground and the return lead of the speaker.

To produce current feedback, sensing resistor R36 is placed in series with the speaker return, thus developing a voltage proportional to the current through the speaker. This voltage is returned to error amplifier 250 (e.g., U2:1) via C8 and R28, where it is magnified and summed with the audio signal from the preamp buffer 245 (e.g., U1:2), before being passed to the modulator section. The output filter capacitor C12 is connected between the output of the amplifier and the current sensing resistor R36 in order to add phase lead to the current sensing signal.

A sharply band-limited system, with a large 2-pole phase shift at the upper end of the audio range, can limit the amount of overall negative feedback that can be taken without instability. The connection of C12 from the amplifier output to the sensing resistor (rather than ground) adds a desirable degree of phase lead to the feedback signal which improves the maximum possible feedback ratio, while still removing switching frequencies in the speaker. Several capacitors C7, C6, and C9 improve closed-loop performance by filtering switching edges, or improving phase margin, in accordance with standard practice in this field.

The overall power amplification system of switchmode amplifier 235 has several important advantages and considerations relative to conventional designs.

Due to high efficiency of switchmode amplifier 235, it is practical to provide more voltage swing in a switchmode power amplifier than would ordinarily be required to meet the nominal power target, which is normally matched to speaker capacity. This allows output voltage of amplifier 200 to increase greatly at frequencies where the speaker impedance rises due to inductance or back EMF, and thus, improves the ability to fully drive the speaker at high and low frequencies. Providing this extra voltage swing with a linear amplifier would be highly inefficient, as the amplifier would spend most of its time in its region of greatest loss, i.e., about 50% of the peak output swing. In contrast, a switchmode amplifier, such as switchmode amplifier 235, has a much lower, and more linear, curve of output loss in comparison to output level. This produces a greater dynamic response and extra voltage swing compared even to a tube amplifier, without the massive inefficiencies of tube technology. In particular, it is now possible to interpose a gain control potentiometer between the output of the clipping processor and the input of the power amplifier, with a maximum level calibrated to produce the rated peak power, but with the amplifier provided with sufficient additional voltage swing that it never clips itself. In this manner it is possible to reproduce the exact same harmonics over the entire volume range of the amplifier, whereas the archetypal tube amplifier only produces its desirable harmonics at its maximum output power, making it less suitable for performance over a wide range of volume requirements.

For similar reasons, losses in switchmode amplifier 235, at a given power level, are much less sensitive to load impedance, and thus, allows for the use of an extension or external speaker 260 without requiring excessive capacity in the amplifier. However, adding a parallel speaker to a current-source amplifier reduces the voltage developed across the load while maintaining the same current, causing the net output power to diminish, contrary to the user's expectation than adding a second speaker will increase the acoustic output. To correct for this, when internal speaker 255 and extension speaker 260 are connected via the designated section of connector J1, a contact opens, which adds additional resistance R35 in series with the feedback signal, thus creating a divider R35 and R34, which reduces the current feedback ratio by a desired amount and thereby maintains the same power into the reduced impedance of a dual-speaker load.

The large reduction of losses in switchmode amplifier 235 reduces heat sink requirements, and when combined with a switchmode power supply, reduces the size and weight of the power section so as to greatly reduce the net weight of an amplifier and its speaker. Furthermore, the ability to provide more power allows a smaller speaker to be used to produce a given sound level, thus providing particular benefits in reducing the size and weight of the popular "combo" format, in which amplifier and speaker are combined in a single cabinet. Although, the amplifier described herein may be configured for maximum power greater than 200 watts, an exemplary power output range of 50 to 200 watts may be provided based on one or more of practical speaker capacities, AC supply limits, and the prevention of hearing loss. Power output of amplifier 200 may be higher when embodiments are directed to bass amplification, over a frequency range that is compatible with the electronic instrument connected. Another benefit of the amplifier described herein may be that an exemplary chassis weight for power sections may be at or below 5 lbs due to the configuration of amplifier 200. In comparison, chassis weight of a conventional amplifier is typically 25 lbs. or more.

III. Speaker Protection Circuit

According to one embodiment, amplifier 200 includes speaker protection circuit 230 to protect against thermal runaway. Speaker protection circuit 230 may be configured to detect an increase of voltage across output terminals due to an increase in the resistive component of the voice coil impedance, and reduce the peak voltage sent to the output to maintain the output within a predetermined limit. Speaker protection circuit 230 reduces the threshold of clipping in order to restrain the applied voltage to the output.

Speaker protection circuit 230 may be based on a nested voltage feedback loop present in switchmode amplifier 235. As the voice coil temperature increases and the impedance rises, the current feedback system naturally commands a greater output voltage across the speaker. Due to the nested voltage feedback loop comprising R32 and R28 plus R29, the output voltage of the error amplifier U2:1 is proportional to the output voltage of the power amplifier, and therefore, output voltage of error amplifier U2:1 can be used to trigger a limiting circuit that increases the voltage sag built into the clipping circuit, and thereby prevents an undue voltage rise across the speaker, without weakening the overdrive or the clean output level. R3 and R6 form a voltage divider, which reduces the output from the error amplifier to a level that matches the junction voltages of Q1 and Q2. In FIG. 2, C1 is added in parallel to compensate for the normal output voltage rise at high frequencies due to voice coil inductance, so that the net detected voltage is substantially determined only by the resistive part of the speaker's impedance. When this voltage swing exceeds the desired limit, Q1 and Q2 begin to conduct and discharge C2, C3 via R7, R8, thus increasing the action of the clipping-sag circuit and thereby limiting the peak power sent to the speaker.

According to another embodiment, it should be appreciated that the actual output voltage of the amplifier could quite easily be used instead of the voltage output of the error amplifier 250, depending on which signal is most conveniently available, with a suitable attenuation to the same junction threshold described herein.

In considering amplifier 200 as a system, it should be apparent that the several subsystems combine in an advantageous manner to produce a result greater than the individual parts. The overdrive/distortion shaping circuit embodies a desirable sag element which also provides a link for an advantageous speaker protection scheme; the use of a high voltage switchmode amplifier, when enhanced with current feedback, provides the desirable extra voltage swing to fully drive the output (e.g., speaker), as well as reducing size and weight, and the speaker protection system allows this extra dynamic headroom to be exploited in normal cases while protecting against extreme and prolonged overloads, thus resulting in an overall level of performance not readily obtained with only parts of the system.

Figures 2, 3:
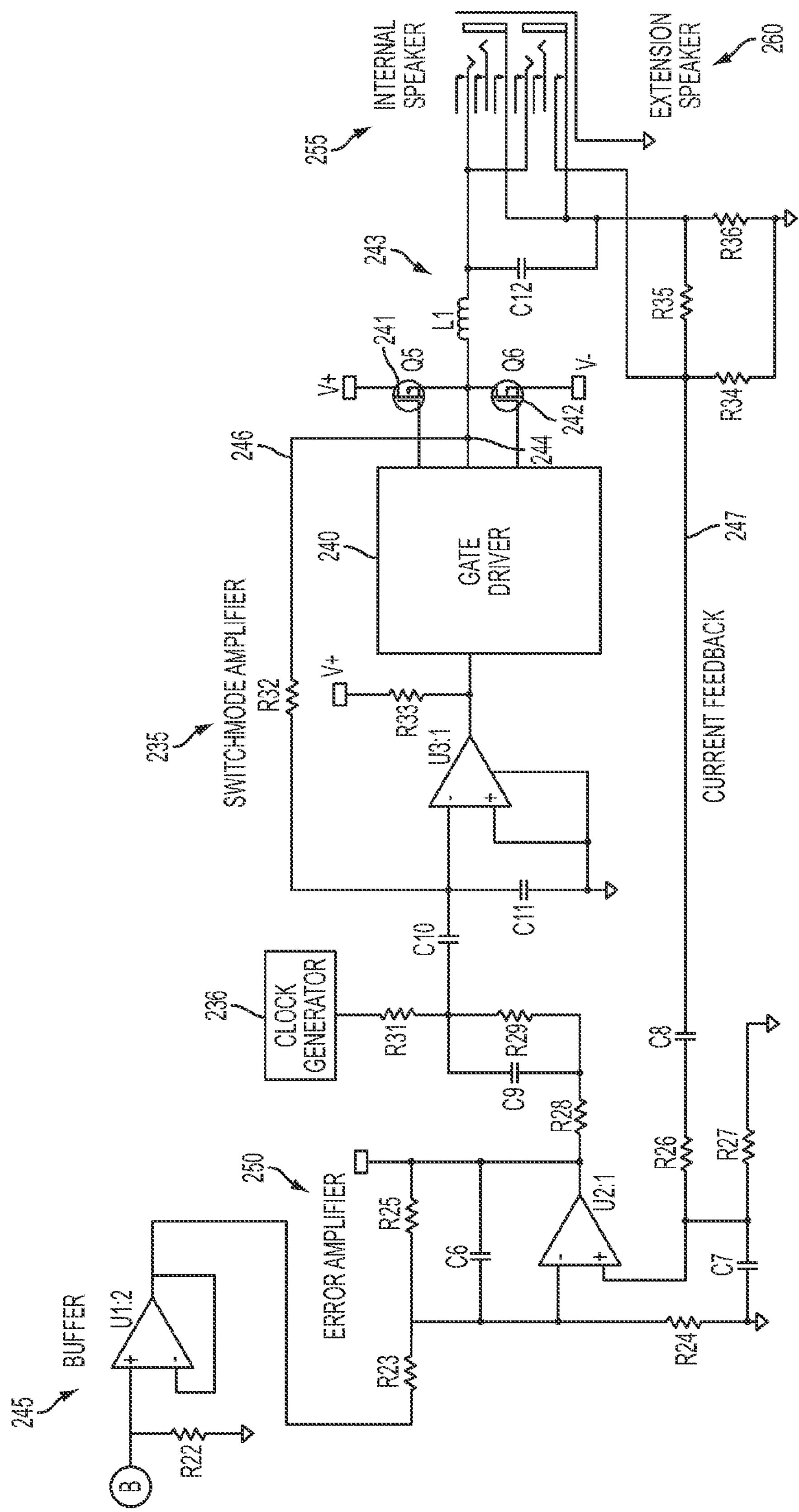
FIG. 3 depicts a simplified block diagram of pre-amplifier components according to one or more embodiments.
Figure 3:
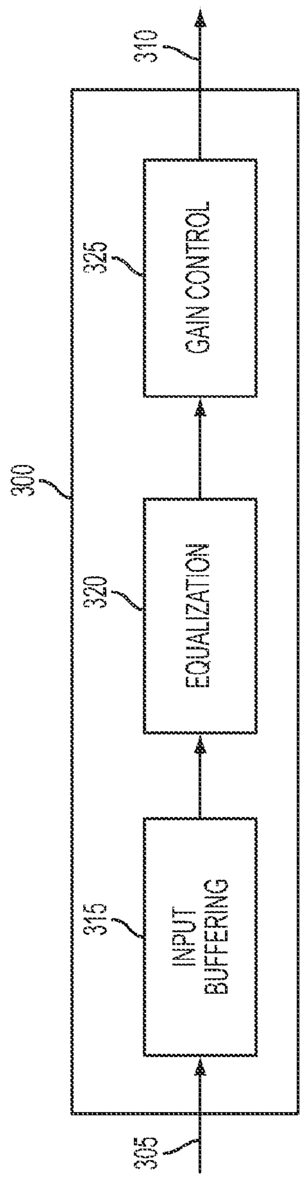

Referring now to FIG. 3, a simplified block diagram is depicted of volume control elements according to one or more embodiments. According to one embodiment, an amplifier may include one or more tonal elements for modifying input signals prior to amplification. Volume controls 300 may be applied to signals received at input 305. Output 310 of volume controls 300 may be included in an amplifier prior to a preamplifier stage (e.g., overdrive shaping element 110). As depicted in FIG. 3, volume controls 300 include input buffering control 315, equalization 320 and gain control 325. Input buffering control 315 may be employed to select a particular input source. Equalization control 320 may be employed for channel equalization and/or compression. Gain control 325 may be employed to set volume of the amplifier (e.g., amplifier 200).

Figure 4:
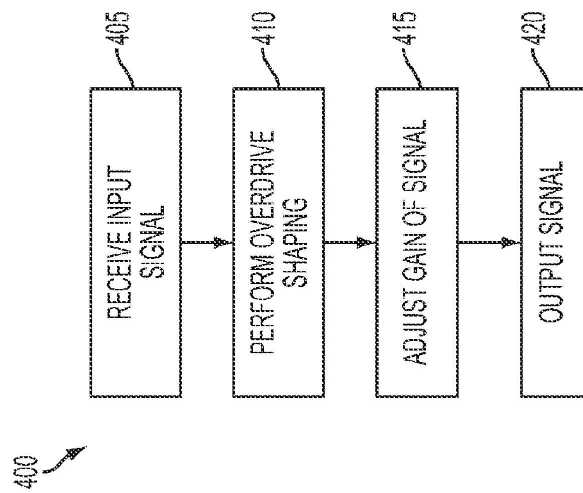
FIG. 4 depicts a process for amplifying a signal according to one or more embodiments.

Referring now to FIG. 4, a process is depicted for operation of an amplifier. Process 400 may include amplifying a signal by a switchmode amplifier to produce the harmonic shape and dynamic response of a tube amplifier. Process 400 may be performed by an amplifier, and in particular, one or more circuit elements of the amplifier (e.g., amplifier 100). Process 400 may be imitated by receiving a signal at block 405. The signal may be received by an input, such as an input terminal for coupling to an instrument. At block 410, an overdrive shaping circuit of the amplifier may perform harmonic shaping on the received signal. At block 415, a harmonic shaped signal from the overdrive shaping circuit may be amplified by a switchmode amplifier of the amplifier. The gain controlled signal may be output at block 420 based on the harmonic shaping of an overdrive shaping circuit and a gain of the switchmode amplifier. One or more acts of process 400 may be performed by analog circuit components of an amplifier. It should be appreciated that in some embodiments, overdrive shaping circuit may include digital signal processing in for harmonic shaping and in some cases in addition to analog circuitry for providing a desired tone.

While the amplifiers have been described above with reference to musical instruments, and in particular guitars, it should be appreciated that the embodiments described herein may similarly be applied to other instruments, methods and types of devices.

While this disclosure has been particularly shown and described with references to exemplary embodiments thereof, it will be understood by those skilled in the art that various changes in form and details may be made therein without departing from the scope of the embodiments encompassed by the appended claims.

What is claimed is:

1. An amplifier comprising:

an input configured to receive a signal from a musical instrument;

an overdrive shaping circuit electrically coupled to the input and configured to receive the input signal, the overdrive shaping circuit including one or more elements for harmonic shaping of the signal including a soft clipping cell with diodes arranged in a current steering bridge that limit a maximum signal swing to a clipping voltage and a sag controller that reduces the clipping voltage of the soft slipping cell when the input signal to the soft clipping cell exceeds a threshold;

a power amplifier circuit electrically coupled to the overdrive shaping circuit, the power amplifier circuit configured to receive a harmonic shaped signal from the overdrive shaping circuit, wherein the power amplifier circuit includes a switchmode amplifier to amplify the harmonic shaped signal, and includes means to increase the output impedance of the switchmode amplifier; and an output coupled to the power amplifier circuit, the output configured to output a signal amplified by the switchmode amplifier.

2. The amplifier of claim 1, wherein the overdrive shaping circuit includes one or more of a zero-crossing processor and an even harmonic generator.

3. The amplifier of claim 1, wherein the sag controller reduces the clipping voltage with a time constant that corresponds to typical musical performance tempos.

4. The amplifier of claim 1, wherein the sag controller includes a pair of capacitors charged to positive and negative voltage levels that are supplied to the current steering bridge and a pair of transistors that deplete the voltages on the capacitors when the input signal to the soft clipping cell exceeds a positive or negative threshold.

5. The amplifier of claim 1, wherein the overdrive shaping circuit includes a zero-crossing processor circuit configured to pass low-level signals intact, and develops a gap at the zero-crossing point in response to signals above a defined threshold, with a time constant that is aligned to typical performance tempos.

6. The amplifier of claim 5, wherein the zero-crossing processor circuit uses positive and negative current sources that maintain a charge on positive and negative capacitors, the capacitors coupled to adjoining positive and negative diodes, wherein the diodes are forward biased to ordinarily maintain signal continuity, wherein when the diodes are driven beyond a defined level the diodes are subject to rectified currents that change voltages of the capacitors causing the diodes to become reverse biased at low voltages such that a central portion of the signal is blanked, with a time constant that is aligned to typical performance tempos.

7. The amplifier of claim 1, wherein the overdrive shaping circuit includes an even harmonic generator circuit configured to produce even order harmonic distortion of a controlled amount at a threshold aligned with, or slightly above, the clipping voltage.

8. The amplifier of claim 7, wherein the even harmonic generator circuit includes a diode and series resistor added to the resistive feedback loop of a linear amplifier stage, the feedback loop adjusted to produce an asymmetrical positive and negative gain at or above the clipping voltage.

9. The amplifier of claim 1, wherein the switchmode amplifier is configured to produce an output impedance higher than impedance of an output load, and to act as a current source into the output with a sufficient peak output voltage to support an extra voltage swing that occurs at impedance peaks without reaching clipping limits of the switchmode amplifier.

10. The amplifier of claim 9, wherein the power amplifier circuit includes an integrator configured to provide modulation for the switchmode amplifier by summing voltage feedback from one or more of switching voltage, a square-wave clock input, and an audio signal input, the integrator to obtain fixed frequency operation with internal error correction.

11. The amplifier of claim 10, wherein the power amplifier circuit includes an error correction amplifier configured to receive a feedback signal from a current sensing element that provides additional current feedback.

12. The amplifier of claim 11, wherein a current feedback ratio is automatically changed upon the connection of an additional parallel speaker to provide a substantially equal or greater total power to the parallel loads.

13. The amplifier of claim 11, wherein the current sensing element is a small-value resistor placed between circuit ground and the return lead of the speaker.

14. The amplifier of claim 13, wherein an output filter capacitor is connected between the output of the amplifier and the current sensing resistor in order to add phase lead to the current sensing signal.

15. The amplifier of claim 1, wherein the switchmode amplifier includes a gate driver configured to drive switching transistors to switch between positive and negative high voltage levels of a pulse-width modulated (PWM) signal.

16. The amplifier of claim 1, wherein the switchmode amplifier is a pulse-width modulated (PWM) amplifier or Class-D amplifier.

17. The amplifier of claim 1, wherein the switchmode amplifier increases the voltage swing in regions where impedance of the output is high.

18. The amplifier of claim 1, wherein the switchmode amplifier is a fixed frequency switching amplifier.

19. The amplifier of claim 1, wherein the switchmode amplifier is characterized by high output impedance by one or more elements of the amplifier.

20. The amplifier of claim 1, wherein the output includes one or more drivers for outputting sound based on the signal amplified by the switchmode amplifier.

21. The amplifier of claim 1, wherein the output includes one or more terminals for outputting a signal to one or more of a cable, sound driver, and speaker assembly.

22. The amplifier of claim 1, further comprising a speaker protection circuit configured to detect an increase of voltage across output terminals due to an increase in the resistive component of the voice coil impedance, and reduce the peak voltage sent to the output to maintain the output within a predetermined limit.

23. The amplifier of claim 22, wherein the speaker protection circuit reduces the clipping voltage in order to restrain the applied voltage to the output.

24. A method for amplifying a signal by a switchmode amplifier to produce the harmonic shape and dynamic response of a tube amplifier, the method comprising the acts of:

receiving an input signal by an input of an amplifier;

performing harmonic shaping on the input signal by an overdrive shaping circuit of the amplifier by applying the input signal to a soft clipping cell that limits a voltage swing of the input signal to a clipping voltage, wherein the clipping voltage is reduced when the input signal exceeds a threshold value;

amplifying a harmonic shaped signal from the overdrive shaping circuit by a switchmode amplifier of the amplifier, wherein the switchmode amplifier is configured to provide increased output impedance; and outputting an amplified signal based on the harmonic shaping of an overdrive shaping circuit and signal output by the switchmode amplifier.

25. The method of claim 24, further comprising detecting an increase of voltage across output terminals of the amplifier due to an increase in a resistive component of voice coil impedance, and reducing peak voltage sent to an output of the amplifier to maintain output signals within a predetermined limit.

26. A guitar amplifier comprising:

an input configured to receive a signal;

an overdrive shaping circuit electrically coupled to the input and configured to receive the input signal, the overdrive shaping circuit including a soft clipping cell that limits a voltage swing of the input signal to a clipping voltage and a sag controller that reduces the clipping voltage when the input signal exceeds a threshold, a zero-crossing processor and an even harmonic generator for harmonic shaping of the signal;

a power amplifier circuit electrically coupled to the overdrive shaping circuit, the power amplifier circuit configured to receive a harmonic shaped signal from the overdrive shaping circuit, wherein the power amplifier circuit includes a switchmode amplifier to amplify the harmonic shaped signal, and includes one or more elements to increase the output impedance of the switchmode amplifier; and an output coupled to the power amplifier circuit, the output configured to output a signal amplified by the switchmode amplifier.

27. The guitar amplifier of claim 26, further comprising a speaker protection circuit configured to further reduce the clipping voltage of the soft clipping cell when an output voltage of the power amplifier exceeds a threshold.

* * * * *